(12) United States Patent
Ionkin

(10) Patent No.: US 8,414,862 B2
(45) Date of Patent: Apr. 9, 2013

(54) PREPARATION OF CZTS AND ITS ANALOGS IN IONIC LIQUIDS

(75) Inventor: Alex Sergey Ionkin, Kennett Square, PA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/502,531

(22) PCT Filed: Nov. 23, 2010

(86) PCT No.: PCT/US2010/057784
§ 371 (c)(1),
(2), (4) Date: Apr. 18, 2012

(87) PCT Pub. No.: WO2011/066273
PCT Pub. Date: Jun. 3, 2011

(65) Prior Publication Data
US 2012/0201742 A1    Aug. 9, 2012

Related U.S. Application Data

(60) Provisional application No. 61/264,368, filed on Nov. 25, 2009.

(51) Int. Cl.
| | |
|---|---|
| *C01B 17/00* | (2006.01) |
| *C01B 19/00* | (2006.01) |
| *C01G 1/00* | (2006.01) |
| *C01G 99/00* | (2010.01) |

(52) U.S. Cl. .................................... 423/508; 423/511
(58) Field of Classification Search ................. 423/508, 423/511
See application file for complete search history.

(56) References Cited

U.S. PATENT DOCUMENTS

| | | | |
|---|---|---|---|
| 6,488,770 B1 | 12/2002 | Meissner et al. | |
| 7,547,347 B2 | 6/2009 | Yang et al. | |
| 2007/0264834 A1 | 11/2007 | Strouse et al. | |
| 2010/0260661 A1* | 10/2010 | Hwang et al. ................. | 423/508 |

FOREIGN PATENT DOCUMENTS

| | | |
|---|---|---|
| CN | 101367541 A | 2/2009 |
| WO | 2007134843 A2 | 11/2007 |
| WO | 2009020436 A1 | 2/2009 |
| WO | 2009041758 A1 | 4/2009 |
| WO | 2010006623 A2 | 1/2010 |

OTHER PUBLICATIONS

Wang, Lihua et al., Synthesis of hierarchical CuS flower-like submicrospheres via an ionic liquid-assisted route, Bull. Mater. Sci., Dec. 2008, pp. 931-935, vol. 31, No. 7.
Todorov, T. et al., Cu2ZnSnS4 films deposited by a soft-chemistry method, Thin Solid Films, 2009, pp. 2541-2544, vol. 517.
Meindersma, G. Wytze et al., Ionic Liquids, Ullmann's Encyclopedia of Industrial Chemistry, Jul. 15, 2007, pp. 1-33.

* cited by examiner

*Primary Examiner* — Timothy Vanoy

(57) ABSTRACT

The present invention relates to synthesis of copper zinc tin sulfide, $Cu_2ZnSnS_4$, and its corresponding selenide and telluride analogs in ionic liquids. $Cu_2ZnSnS_4$ and related compounds are useful as absorber materials in thin film solar cells.

12 Claims, 2 Drawing Sheets

PREPARATION OF CZTS AND ITS ANALOGS IN IONIC LIQUIDS

This application claims the benefit of U.S. Provisional Patent Application No. 61/264,368, filed Nov. 25, 2009 which is herein incorporated by reference.

FIELD OF THE INVENTION

The present invention relates to synthesis of copper zinc tin sulfide, $Cu_2ZnSnS_4$, and its corresponding selenide and telluride analogs in ionic liquids. $Cu_2ZnSnS_4$ and related compounds are useful as absorber materials in thin film solar cells.

BACKGROUND

Solar cells, also termed photovoltaic or PV cells, convert sunlight into electricity. Traditionally, these electronic devices have been fabricated using silicon (Si) as a light-absorbing, semiconducting material in a relatively expensive production process. To make solar cells more economically viable, solar cell device architectures have recently been developed that use thin-film, light-absorbing semiconductor materials such as copper-indium-gallium-sulfo-di-selenide, also termed CIGS.

Despite the demonstrated potential of CIGS in thin-film solar cells, the toxicity and low abundance of indium and selenium are major impediments to the widespread use and acceptance of CIGS in commercial devices. Attractive alternatives to CIGS include quaternary chalcogenides, particularly copper zinc tin sulfide, $Cu_2ZnSnS_4$ (CZTS). It has a bandgap of about 1.5 eV, well within the solar spectrum, and an absorption coefficient greater than 104 $cm^{-1}$. In addition, the CZTS elements are non-toxic and abundant.

CTZS and its Se and Te analogs have been produced from solution using ultrasonic or microwave initiation. In some instances, additional additives have been employed in processes to produce the chalcogenide analogs. CZTS has also been produced by vapor deposition techniques.

There remains a need for a robust process to produce CZTS and it chalcogenide analogs at a commercial scale.

SUMMARY

One aspect is a process to form $Cu_2ZnSn(chalcogen)_4$ comprising heating a composition comprising:
a) an ionic liquid;
b) a copper source;
c) a zinc source;
d) a tin source; and
e) a chalcogen source;
to a temperature of about 100° C. to about 500° C.,
wherein the molar ratio of Cu:Zn:Sn:chalcogen is about 2:1:1:4 to about 2:1:1:50.

DETAILED DESCRIPTION

Figure 1:
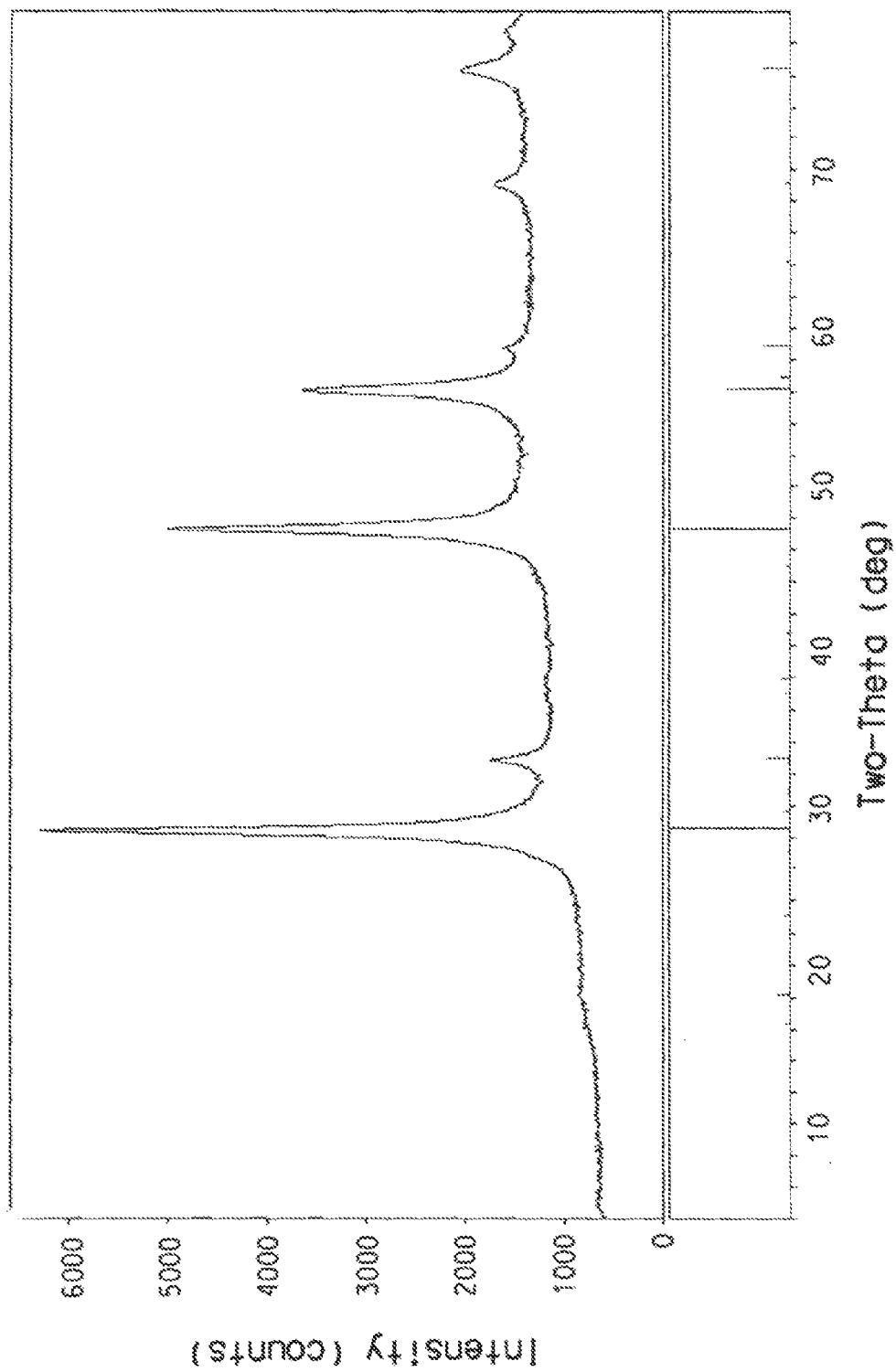
FIGS. 1 and 2 are x-ray powder diffraction patterns of CZTS prepared in one embodiment.

Described herein is a process to form $Cu_2ZnSn(chalcogen)_4$ comprising heating a composition comprising:
a) an ionic liquid;
b) a copper source;
c) a zinc source;
d) a tin source; and
e) a chalcogen source;
to a temperature of about 100° C. to about 500° C.,
wherein the molar ratio of Cu:Zn:Sn:chalcogen is about 2:1:1:4 to about 2:1:1:50.

In one embodiment, the $Cu_2ZnSn(chalcogen)_4$ comprises $Cu_2ZnSnS_4$, $Cu_2ZnSnSe_4$, or $Cu_2ZnSnTe_4$.

"Ionic liquids" are organic salts that are fluid at or below about 100° C., and preferably at or below about room temperature (about 25° C.). Ionic liquids comprise a cationic component and an anionic component. Typically, the cationic component is organic and the anionic component is either inorganic or organic. Suitable ionic liquids are inert to all reagents and products, and are stable at reaction temperatures. One ionic liquid or a mixture may be used.

Suitable cationic components of the ionic liquid are described by the following formulae:

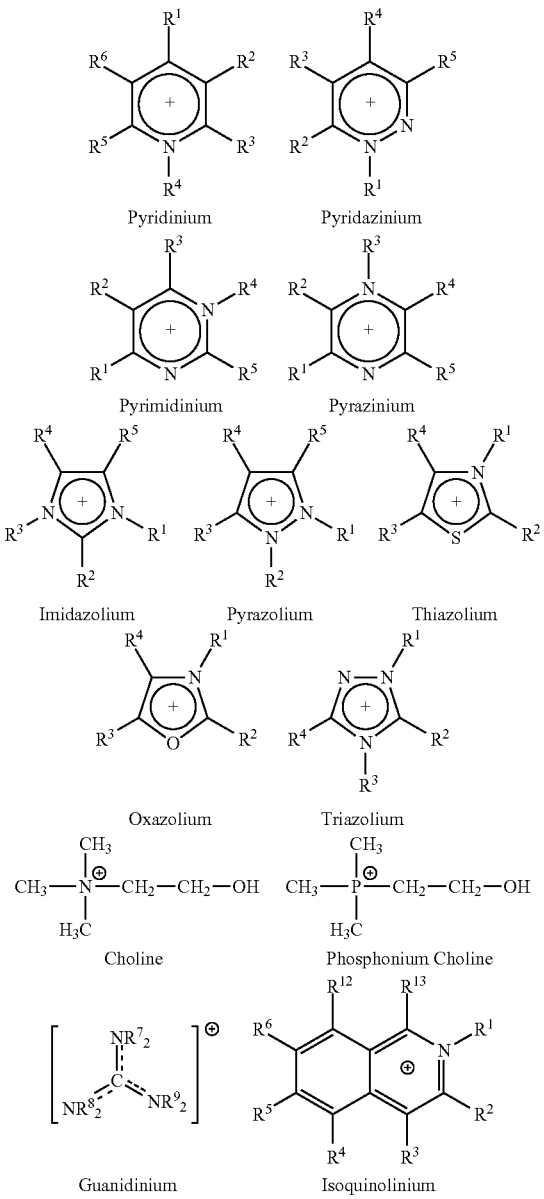

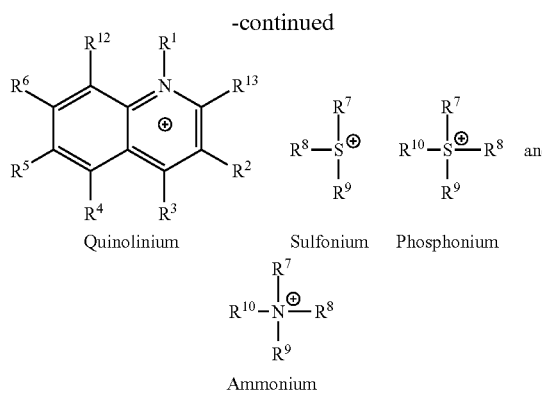

Quinolinium    Sulfonium    Phosphonium

Ammonium wherein $R^1, R^2, R^3, R^4, R^5, R^6, R^{12}$ and $R^{13}$ are independently selected from the group consisting of:
(i) H;
(ii) halogen;
(iii) —$CH_3$, —$C_2H_5$, or $C_3$ to $C_{25}$ straight-chain, branched or cyclic alkane or alkene, optionally substituted with at least one member selected from the group consisting of Cl, Br, F, I, OH, $NH_2$ and SH;
(iv) —$CH_3$, —$C_2H_5$, or $C_3$ to $C_{25}$ straight-chain, branched or cyclic alkane or alkene comprising one to three heteroatoms selected from the group consisting of O, N, Si and S, and optionally substituted with at least one member selected from the group consisting of Cl, Br, F, I, OH, $NH_2$ and SH;
(v) $C_6$ to $C_{20}$ unsubstituted aryl, or $C_3$ to $C_{25}$ unsubstituted heteroaryl having one to three heteroatoms independently selected from the group consisting of O, N, Si and S; and
(vi) $C_6$ to $C_{25}$ substituted aryl, or $C_3$ to $C_{25}$ substituted heteroaryl having one to three heteroatoms independently selected from the group consisting of O, N, Si and S; and wherein said substituted aryl or substituted heteroaryl has one to three substituents independently selected from the group consisting of:
  (1) —$CH_3$, —$C_2H_5$, or $C_3$ to $C_{25}$ straight-chain, branched or cyclic alkane or alkene, optionally substituted with at least one member selected from the group consisting of Cl, Br, F I, OH, $NH_2$ and SH;
  (2) OH;
  (3) $NH_2$; and
  (4) SH;
(vii) —$(CH_2)_nSi(CH_2)_mCH_3$, —$(CH_2)_nSi(CH_3)_3$, —$(CH_2)_nOSi(CH_3)_m$, where n is independently 1, 2, 3 or 4 and m is independently 0, 1, 2, 3, or 4, and wherein the Si is tetravalent; and $R^7, R^8, R^9$, and $R^{10}$ are independently selected from the group consisting of:
(viii) —$CH_3$, —$C_2H_5$, or $C_3$ to $C_{25}$ straight-chain, branched or cyclic alkane or alkene, optionally substituted with at least one member selected from the group consisting of Cl, Br, F, I, OH, $NH_2$ and SH;
(ix) —$CH_3$, —$C_2H_5$, or $C_3$ to $C_{25}$ straight-chain, branched or cyclic alkane or alkene comprising one to three heteroatoms selected from the group consisting of O, N, Si and S, and optionally substituted with at least one member selected from the group consisting of Cl, Br, F, I, OH, $NH_2$ and SH;
(x) $C_6$ to $C_{25}$ unsubstituted aryl, or $C_3$ to $C_{25}$ unsubstituted heteroaryl having one to three heteroatoms independently selected from the group consisting of O, N, Si and S; and
(xi) $C_6$ to $C_{25}$ substituted aryl, or $C_3$ to $C_{25}$ substituted heteroaryl having one to three heteroatoms independently selected from the group consisting of O, N, Si and S; and wherein said substituted aryl or substituted heteroaryl has one to three substituents independently selected from the group consisting of:
  (1) —$CH_3$, —$C_2H_5$, or $C_3$ to $C_{25}$ straight-chain, branched or cyclic alkane or alkene, optionally substituted with at least one member selected from the group consisting of Cl, Br, F, I, OH, $NH_2$ and SH,
  (2) OH,
  (3) $NH_2$, and
  (4) SH; and
(xii) —$(CH_2)_nSi(CH_2)_mCH_3$, —$(CH_2)_nSi(CH_3)_3$, $(CH_2)_n OSi(CH_3)_m$, where $n$ is independently 1, 2, 3 or 4 and m is independently 0, 1, 2, 3, or 4, and wherein the Si is tetravalent;
wherein optionally at least two of $R^1, R^2, R^3, R^4, R^5, R^6, R^7, R^8, R^9$, and $R^{10}$ can together form a ring.

Suitable anionic components of the ionic liquid include: chloroaluminate, bromoaluminate, tetrachloroborate, p-toluenesulfonate, tetrabromoaluminate, perchlorate, hydroxide anions, $[CH_3CO_2]^-$, $[HSO_4]^-$, $[CH_3OSO_3]^-$, $[C_2H_5OSO_3]^-$, $[AlCl_4]^-$, $[CO_3]^{2-}$, $[HCO_3]^-$, $[NO_2]^-$, $[NO_3]^-$, $[SO_4]^{2-}$, $[PO_3]^{3-}$, $[HPO_3]^{2-}$, $[H_2PO_3]^{1-}$, $[PO_4]^{3-}$, $[HPO_4]^{2-}$, $[H_2PO_4]^-$, $[HSO_3]^-$, $[CuCl_2]^-$, halide [$Cl^-$, $Br^-$, $I^-$], $SCN^-$; $BR^1R^2R^3R^4$, $BOR^1OR^2OR^3OR^4$, $[BF_4]^-$, $[PF_6]^-$, $[SbF_6]^-$, $[CF_3SO_3]^-$, $[HCF_2CF_2SO_3]^-$, $[CF_3HFCCF_2SO_3]^-$, $[HCClFCF_2SO_3]^-$, $[(CF_3SO_2)_2N]^-$, $[(CF_3CF_2SO_2)_2N]^-$, $[(CF_3SO_2)_3C]^-$, $[CF_3CO_2]^-$, $[CF_3OCFHCF_2SO_3]^-$, $[CF_3CF_2OCFHCF_2SO_3]^-$, $[CF_3CFHOCF_2CF_2SO_3]^-$, $[CF_2HCF_2OCF_2CF_2SO_3]^-$, $[CF_2ICF_2OCF_2CF_2SO_3]^-$, $[CF_3CF_2OCF_2CF_2SO_3]^-$, $[(CF_2HCF_2SO_2)_2N]^-$, $[(CF_3CFHCF_2SO_2)_2N]^-$; and $F^-$.

Other suitable anionic components include those represented by the structure of the following formula:

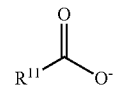

wherein $R^{11}$ is selected from the group consisting of:
i) —$CH_3$, —$C_2H_5$, or $C_3$ to $C_{10}$ straight-chain, branched or cyclic alkane or alkene, optionally substituted with at least one member selected from the group consisting of Cl, Br, F, I, OH, $NH_2$ and SH;
(ii) —$CH_3$, —$C_2H_5$, or $C_3$ to $C_{10}$ straight-chain, branched or cyclic alkane or alkene comprising one to three heteroatoms selected from the group consisting of O, N, Si and S, and optionally substituted with at least one member selected from the group consisting of Cl, Br, F, I, OH, $NH_2$ and SH;
(iii) $C_6$ to $C_{10}$ unsubstituted aryl, or $C_3$ to $C_{10}$ unsubstituted heteroaryl having one to three heteroatoms independently selected from the group consisting of O, N, Si and S; and
(iv) $C_6$ to $C_{10}$ substituted aryl, or $C_3$ to $C_{10}$ substituted heteroaryl having one to three heteroatoms independently selected from the group consisting of O, N, Si and S; and wherein said substituted aryl or substituted heteroaryl has one to three substituents independently selected from the group consisting of:
  (1) —$CH_3$, —$C_2H_5$, or $C_3$ to $C_{10}$ straight-chain, branched or cyclic alkane or alkene, optionally substituted with at least one member selected from the group consisting of Cl, Br, F I, OH, $NH_2$ and SH;

(2) OH;
(3) NH$_2$; and
(4) SH.

In one embodiment, the cationic component is selected from the group consisting of pyridinium, pyridazinium, pyrimidinium, pyrazinium, imidazolium, pyrazolium, thiazolium, oxazolium, triazolium, isoquinolium, quinolium, choline, phosphonium choline, guanidinium, sulfonium, phosphonium, and tetraalkylammonium cations Suitable anionic components also include aminoacetate (glycine), ascorbate, benzoate, catecholate, citrate, dimethylphosphate, formate, fumarate, gallate, glycolate, glyoxylate, iminodiacetate, isobutyrate, kojate (5-hydroxy-2-hydroxymethyl-4-pyrone ion), lactate, levulinate, oxalate, pivalate, propionate, pyruvate, salicylate, succinamate, succinate, tiglate (CH$_3$CH=C(CH$_3$)COO$^-$), and tropolonate (2-hydroxy-2,4,6-cycloheptatrien-1-one ion).

Other suitable anionic components are based on phosphorus compounds as represented by the following structures, wherein R$^1$ and R$^2$ are as set forth above:

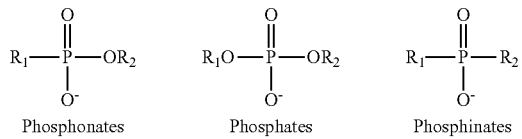

In one embodiment, the ionic liquid comprises tributylmethylammonium, 1,2,4-trimethylpyrazolium, or 1,2,3-trimethylpyrazolium as the cation, and methylsulfate as the anion.

Some suitable ionic liquids are formed by reacting a nitrogen-containing heterocyclic ring, preferably a heteroaromatic ring, with an alkylating agent (for example, an alkyl halide) to form a quaternary ammonium salt, followed by an ion exchange or reaction with a Lewis acid or its conjugate base to form the ionic liquid. Ionic liquids suitable for use herein can also be synthesized by salt metathesis, by an acid-base neutralization reaction, or by quaternizing a selected nitrogen-containing compound. Many ionic liquids are also available from commercial sources.

By "a copper source", "a zinc source", and "a tin source" it is meant a salt or complex containing copper, zinc or tin, respectively. The salt or complex can contain any anion, ligand, or additional cation that is stable at reaction temperatures, does not adversely affect the process or the final product. Typical salts or complexes are halogens such as chloride, and organic acids such as acetate. The salt or complex can additionally contain waters of hydration. Suitable complexes include metal chalcogenides, e.g., copper sulfides, zinc sulfide, tin sulfides, and their selenide and telluride analogs. Elemental metal (i.e., copper, zinc or tin) can also be used as the copper source, zinc source or tin source. Mixtures of salts, complexes and elemental metals can also be used.

In the processes of this invention, copper, zinc, tin, and chalcogen are in a molar ratio of Cu:Zn:Sn:chalcogen of about 2:1:1:4 to about 2:1:1:50. The molar ratios of Cu, Zn, and Sn can deviate from integer ratios by about 20 molar %, such that suitable ratios include Cu:Zn:Sn from 2 to 0.8 to 0.8 up to 2 to 1.2 to 1.2. The molar ratio of chalcogen:Cu is at least 4:2, but can be as high as 8:2 or 10:2 or 20:2 or 50:2.

As used herein, the term "chalcogen" refers to sulfur (S), selenium (Se), and tellurium (Te).

The chalcogen source is any salt or complex containing chalcogen that is nucleophilic. The term "nucleophilic" is recognized in the art as pertaining to a chemical moiety having a reactive pair of electrons. Typically, the chalcogen source is a salt or complex containing a sulfide anion (e.g., a hydrogen sulfide anion (HS$^-$), a sulfide anion (S$_2^-$) or a polysulfide anion), or the analogous selenide or telluride anions. Suitable cations include organic acids, and alkali and alkaline earth metals. Copper sulfides, zinc sulfide, tin sulfides, and their selenide and telluride analogs are also suitable chalcogen sources.

The composition is prepared by mixing the copper source, the zinc source, and tin source, and the chalcogen source with the ionic liquid. The order of mixing is not critical, but typically the copper source, the zinc source, and tin source are first dissolved in the ionic liquid, followed by the addition of the chalcogen source. The amounts of each is not critical as long as the molar ratio of Cu:Zn:Sn:chalcogen is between about 2:1:1:4 to about 2:1:1:50, as described above.

The composition is heated to a temperature of about 100° C. to about 500° C., or about 150° C. to about 200° C. The temperature and time of heating can vary depending on thermal stability of the ionic liquid used, the nature of the metal and chalcogen sources, and the desired reaction rate. Reaction times can be between a few minutes and a few days.

Depending on the choice of ionic liquid, the reaction product may begin to form and appear as a solid precipitate, even during the heating step. It is possible to isolate the solid product at that point, but it is usually more convenient to cool the reaction first in an optional cooling step.

Typically, it is also advantageous to add a polar solvent to the reaction mixture in an optional step to precipitate the product and facilitate the isolation of the product. The polar solvent does not dissolve the solid product, but is miscible with the ionic liquid. A single polar solvent or a mixture of solvents can be used. Suitable polar solvents include water, alcohols, and mixtures thereof. The alcohol is typically a C$_1$ to C$_6$ saturated alcohol, such as methanol, ethanol, propanol or butanol.

The solid reaction product comprises particles of Cu$_2$ZnSn(chalcogen)$_4$, where the identity of the chalcogen is determined by the source of the chalcogen used in the process. If the chalcogen source comprises more than one of S, Se and Te, then the Cu$_2$ZnSn(chalcogen)$_4$ product will be a mixture of two or more of CZTS, CZTSe, CZTTe, and Cu$_2$ZnSn (S$_a$Se$_b$Te$_c$)$_4$, where a, b, and c can be fractions or integers, are independently 0 to 4, and a+b+c=4. The term "CZTS" refers to Cu$_2$ZnSnS$_4$, "CZTSe" refers to Cu$_2$ZnSnSe$_4$, "CZTTe" refers to Cu$_2$ZnSnTe$_4$; and "CZT(S,Se,Te)" encompasses all compounds of formula Cu$_2$ZnSn(S$_a$Se$_b$Te$_c$)$_4$, as defined above. CZTS and its analogs may also be doped by small amounts of other elements, such as alkali and alkali earth metals, wherein the dopants are typically derived from the chalcogen source.

The process can further comprise the step of separating the solid product from the reaction mixture. The separation can be done by any means known in the art, such as filtration or centrifugation. In one embodiment, the product is Cu$_2$ZnSnS$_4$.

EXAMPLES

Copper (II) acetate monohydrate, zinc (II) acetate dihydrate, and tin (II) chloride were purchased from Alfa Aesar (Ward Hill, Mass.). Tetraethylammonium sulfide was purchased from Fluka (Riedel-de-Haen, Germany). The ionic liquids (tributylmethylammonium methylsulfate; 1,2,4-trimethylpyrazolium methylsulfate; and 1,2,3-trimethylpyrazolium methylsulfate) were purchased from Aldrich (St. Louis, Mo.).

Example 1

Tributylmethylammonium methylsulfate (20 g) was heated with stirring at 180° C. under nitrogen. Copper acetate monohydrate (0.9086 g, 4.55 mmol)) was added and dissolved, followed by 0.4995 g (2.27 mmol) of zinc acetate dihydrate, and then 0.5135 g (2.27 mmol) of tin(II) chloride dihydrate.

After dissolution of the metal salts, 2.96 g (18.2 mmol) of tetraethylammonium sulfide was added in one portion. The reaction mixture was kept at 180° C. for 5 hr, during which time the formation of solids was observed. The reaction mixture was cooled and then diluted with 100 ml of methanol. The reaction mixture was filtered and the solid product dried in vacuum, giving a black powder (1.12 g, 56%).

Analysis of the black powder by XRD confirmed the presence of CZTS, as shown in FIG. 1

Example 2

The procedure of Example 1 was repeated, using 1,2,4-trimethylpyrazolium methylsulfate (20 g) in place of tributylmethylammonium methylsulfate. The yield of black powder was 1.40 g (70%).

Figure 2:
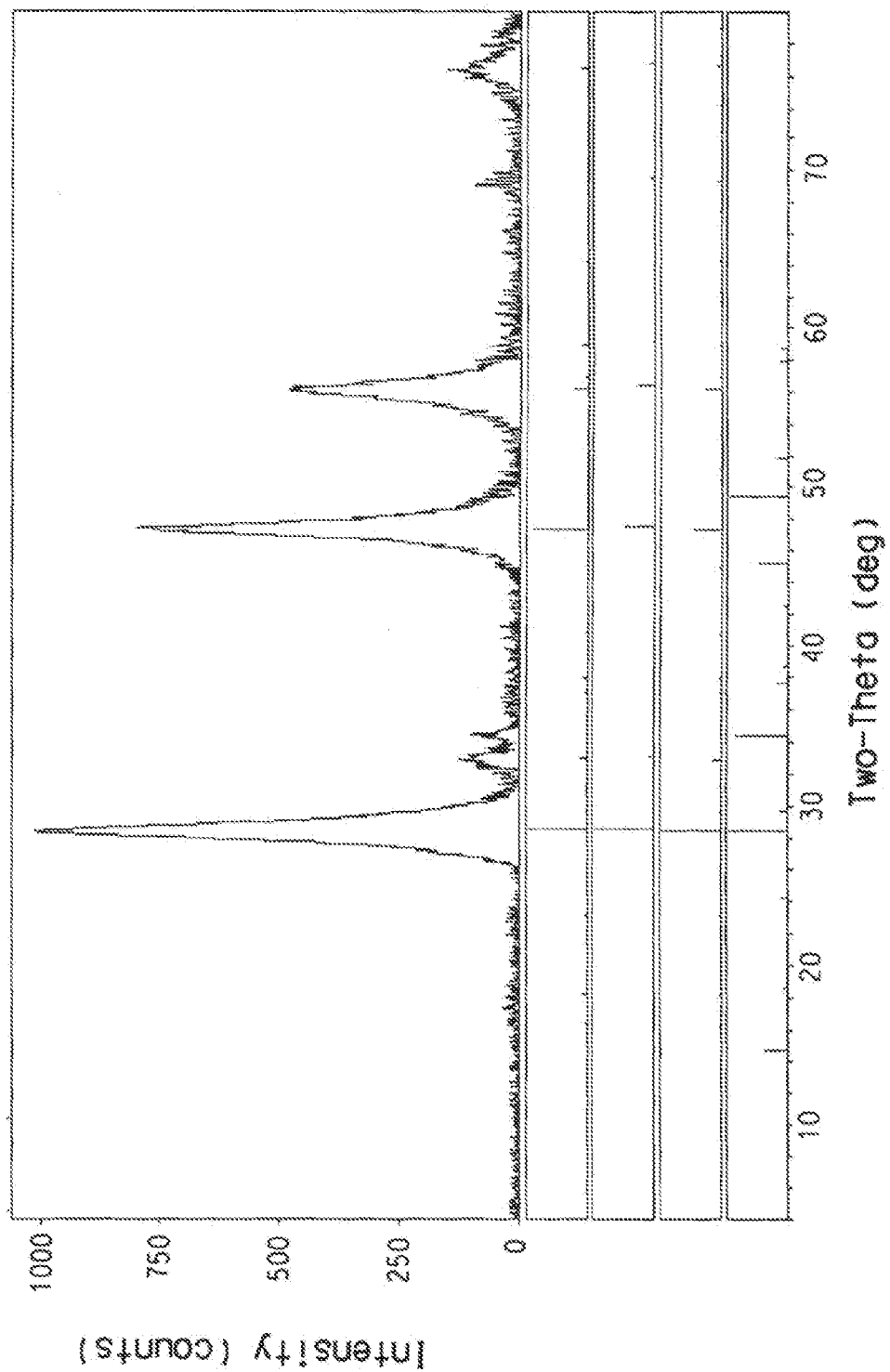

Analysis of the black powder by XRD confirmed the presence of CZTS, as shown in FIG. 2.

What is claimed is:

1. A process to form $Cu_2ZnSn(chalcogen)_4$, comprising heating to a temperature of about 100° C. to about 500° C. a composition comprising:
    a) an ionic liquid;
    b) a copper source;
    c) a zinc source;
    d) a tin source; and
    e) a chalcogen source;
    wherein the molar ratio of Cu:Zn:Sn:chalcogen is about 2:1:1:4 to about 2:1:1:50.

2. The process of claim 1, wherein the $Cu_2ZnSn(chalcogen)_4$ comprises $Cu_2ZnSnS_4$, $Cu_2ZnSnSe_4$, or $Cu_2ZnSnTe_4$.

3. The process of claim 1, further comprising separating the $Cu_2ZnSn(chalcogen)_4$ from the ionic liquid.

4. The process of claim 1, wherein the ionic liquid comprises a cationic component and an anionic component, and the cationic component is selected from the group consisting of pyridinium, pyridazinium, pyrimidinium, pyrazinium, imidazolium, pyrazolium, thiazolium, oxazolium, triazolium, isoquinolium, quinolium, choline, phosphonium choline, guanidinium, sulfonium, phosphonium and tetraalkylammonium cations.

5. The process of claim 1, wherein the ionic liquid comprises tributylmethylammonium methylsulfate, 1,2,4-trimethylpyrazolium methylsulfate, or 1,2,3-trimethylpyrazolium methylsulfate.

6. The process of claim 1, wherein the chalcogen source comprises a sulfide anion.

7. The process of claim 1, wherein the composition is heated to a temperature of about 150° C. to about 200° C.

8. The process of claim 1, further comprising cooling the composition.

9. The process of claim 8, further comprising precipitating the $Cu_2ZnSn(chalcogen)_4$ by adding water or an alcohol to the composition after cooling.

10. The process of claim 9, wherein the alcohol is a $C_1$ to $C_6$ saturated alcohol.

11. The process of claim 9, further comprising isolating the $Cu_2ZnSn(chalcogen)_4$ by filtration or centrifugation.

12. The process of claim 11, wherein the $Cu_2ZnSn(chalcogen)_4$ is $Cu_2ZnSnS_4$.

* * * * *